United States Patent
Xiao

(10) Patent No.: US 9,558,704 B2
(45) Date of Patent: Jan. 31, 2017

(54) GOA CIRCUIT AND LIQUID CRYSTAL DISPLAY

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Juncheng Xiao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/761,102

(22) PCT Filed: Apr. 30, 2015

(86) PCT No.: PCT/CN2015/077999
§ 371 (c)(1),
(2) Date: Jul. 15, 2015

(87) PCT Pub. No.: WO2016/161679
PCT Pub. Date: Oct. 13, 2016

(65) Prior Publication Data
US 2016/0307531 A1    Oct. 20, 2016

(30) Foreign Application Priority Data
Apr. 7, 2015 (CN) .................. 2015 1 01606973

(51) Int. Cl.
*G09G 3/36* (2006.01)
*H01L 27/12* (2006.01)

(52) U.S. Cl.
CPC .......... *G09G 3/3677* (2013.01); *H01L 27/124* (2013.01); *G09G 2310/0251* (2013.01);
(Continued)

(58) Field of Classification Search
CPC .............. G09G 2310/0286; G09G 2310/0267; G09G 2300/0408; G09G 2300/0426; G09G 3/3648; G09G 3/3677; G09G 3/3674; G09G 3/3696; G09G 3/3266
(Continued)

(56) References Cited

U.S. PATENT DOCUMENTS

| | | | | |
|---|---|---|---|---|
| 2010/0150302 A1* | 6/2010 | Tsai | ........... | G11C 19/28 377/79 |
| 2010/0214279 A1* | 8/2010 | Kim | ........... | G09G 3/344 345/213 |
| 2012/0153996 A1* | 6/2012 | Su | ........... | G09G 3/3659 327/109 |

* cited by examiner

*Primary Examiner* — Kent Chang
*Assistant Examiner* — Andrew Lee
(74) *Attorney, Agent, or Firm* — Andrew C. Cheng

(57) ABSTRACT

The disclosure discloses a GOA circuit and a liquid crystal display. The GOA circuit comprises a plurality of GOA units, each sequentially charging the Nth-staged horizontal scanning lines and the (N+1)th-staged horizontal scanning lines in the display region. The GOA unit comprises N-staged pull-up control circuits, (N+1)-staged pull-up control circuits, N-staged pull-up circuits, (N+1)-staged pull-up circuits, N-staged pull-down circuits, (N+1)-staged pull-down circuits, and a pull-down holding circuit. The pull-down holding circuit holds the voltage level of the Nth-staged gate signal point and the Nth-staged horizontal scanning line to the low level after the Nth-staged horizontal scanning line is charged, and holds the voltage level of the (N+1)th-staged gate signal point and the Nth-staged horizontal scanning line to the low level after the (N+1)th-staged horizontal scanning line is charged. By way of such configuration, the two-staged GOA units share a common pull-down holding circuit to further reduce the power consumption.

18 Claims, 5 Drawing Sheets

(52) U.S. Cl.
CPC ... *G09G 2310/061* (2013.01); *G09G 2310/08* (2013.01); *G09G 2330/021* (2013.01)

(58) Field of Classification Search
USPC .................................... 345/87, 92, 99, 100
See application file for complete search history.

GOA CIRCUIT AND LIQUID CRYSTAL DISPLAY

BACKGROUND

Technical Field

The disclosure is related to the technology field for the liquid crystal display, and more particular to a GOA circuit and a liquid crystal display.

Related Art

Gate Driver on Array, referred as GOA, is a technology that uses the current array manufacture process for the thin film transistor liquid crystal display to fabricate the gate scanning driving signal circuit on the array substrate to achieve the driving approach on the gate by way of scanning line by line.

The current GOA circuit is composed of a pull-up part, a pull-up control part, a transfer part, a pull-down part, a pull-down holding part and a boost part for boosting the voltage. The pull-up part outputs the inputted clock signal to the gate terminal as a driving signal for the display device. The pull-up control part controls turning-on of the pull-up part. The control of the turning-on is usually performed by the signal transmitted from the upper stage GPA circuit. The pull-down circuit pulls down the gate to the low voltage level upon the completion of the output by the gate, i.e. closing the gate signal. The pull-down holding circuit usually holds the gate output signal and the gate signal (usually referred as Q point) of the pull-up part at the turn-off state (that is the set negative voltage level). There are usually two pull-down parts functioning alternatively. The boost part boosts the voltage level of the Q point again. This ensures the normal output for G(N) of the pull-up part.

However, each stage has a pull-down holding part in such design, and there are two parts functioning alternatively. The power consuming is large and is not good for environment protection.

SUMMARY

The technical problem mainly solved by the present disclosure is to provide a GOA circuit and a liquid crystal display to reduce the power consumption of the GOA circuit in the liquid crystal display.

In order to solve the above technical problem, one technical solution adopted by the present disclosure is to provide a GOA circuit, the GOA circuit comprising a plurality of GOA units, each of the GOA unit sequentially charging the Nth-staged horizontal scanning lines and the (N+1)th-staged horizontal scanning lines in the display region, the GOA unit comprising N-staged pull-up control circuits, (N+1)-staged pull-up control circuits, N-staged pull-up circuits, (N+1)-staged pull-up circuits, N-staged pull-down circuits, (N+1)-staged pull-down circuits, and a pull-down holding circuit; wherein the N-staged pull-up circuits and the pull-down holding circuit respectively connect to the Nth-staged gate signal point and the Nth-staged horizontal scanning line, and the N-staged pull-up control circuits and the N-staged pull-down circuits connected to the Nth-staged gate signal point wherein the (N+1)-staged pull-up circuits and the pull-down holding circuit respectively connect to the (N+1)th-staged gate signal point and the (N+1)th-staged horizontal scanning line, and the (N+1)-staged pull-up control circuits and the (N+1)-staged pull-down circuits connect to the (N+1)th-staged gate signal point; wherein the pull-down holding circuit holds the voltage level of the Nth-staged gate signal point and the Nth-staged horizontal scanning line to the low level after the Nth-staged horizontal scanning line is charged, and holds the voltage level of the (N+1)th-staged gate signal point and the (N+1)th-staged horizontal scanning line to the low level after the Nth-staged horizontal scanning line is charged; wherein the pull-down holding circuit comprises: a first transistor having a gate and a drain connected to a first clock signal; a second transistor having a gate connected to the source of the first transistor, a drain connected to the first clock signal, and a source connected to a first common point; a third transistor having a gate connected to the second clock signal, a drain connected to the first clock signal, and a source connected to the first common point; a fourth transistor having a gate and drain connected to the first common point; a fifth transistor having a gate connected to the Nth-staged gate signal point, a drain connected to the source of the first transistor and the source of the fourth transistor, and a source connected to the first direct current low voltage; a sixth transistor having a gate connected to the (N+1)th-staged gate signal point, a drain connected to the source of the first transistor, and a source connected to the first direct current low voltage; a seventh transistor having a gate connected to the first common point, a drain connected to the (N+1)th-staged gate signal point, and a source connected to the first direct current low voltage; an eighth transistor having a gate connected to the first common point, a drain connected to the (N+1)th-staged horizontal scanning line and a source connected to the first direct current low voltage; a ninth transistor having a gate connected to a second common point, a drain connected to the (N+1)-staged gate signal point, and a source connected to the first direct current low voltage; a tenth transistor having a gate connected to the second common point, a drain connected to the (N+1)th-staged horizontal scanning line, and a source connected to the first direct current low voltage; an eleventh transistor having a gate and a drain connected to the second clock signal; a twelfth transistor having a gate connected to the source of the eleventh transistor, a drain connected to the second clock signal, and a source connected to the second common point; a thirteenth transistor having a gate connected to the first clock signal, a drain connected to the second clock signal, and a source connected to the second common point; a fourteenth transistor having a gate and a drain connected to the second common point; a fifteenth transistor having a gate connected to the Nth-staged gate signal point, a drain connected to the source of the eleventh transistor and the source of the fourteenth transistor, and a source connected to the first direct current low voltage; a sixteenth transistor having a gate connected to the (N+1)th-staged gate signal point, a drain connected to the source of the eleventh transistor, and a source connected to the first direct current low voltage; a seventh transistor having a gate connected to the second common point, a drain connected to the Nth-staged gate signal point, and a source connected to the first direct current low voltage; an eighteenth transistor having a gate connected to the second common point, a drain connected to the Nth-staged horizontal scanning line, and a source connected to the first direct current low voltage; a nineteenth transistor having a gate connected to the first common point, a drain connected to the Nth-staged gate signal point, and a source connected to the first direct current low voltage; and a twentieth transistor having a gate connected to the first common point, a drain connected to the Nth-staged horizontal scanning line, and a source connected to the first direct current low voltage; wherein the GOA unit further comprises a reset circuit connected to the Nth-staged gate signal point, the (N+1)th-staged gate signal point and the first direct current low voltage, for pulling down the voltage level of the Nth-staged gate signal point and the (N+1)th-staged gate signal point to the low voltage level after a reset signal is received.

In order to solve the above technical problem, another technical solution adopted by the present disclosure is to provide a GOA circuit the GOA circuit comprising a plurality of GOA units, each of the GOA unit sequentially charging the Nth-staged horizontal scanning lines and the (N+1)th-staged horizontal scanning lines in the display region, the GOA unit comprising N-staged pull-up control circuits, (N+1)-staged pull-up control circuits, N-staged pull-up circuits, (N+1)-staged pull-up circuits, N-staged pull-down circuits, (N+1)-staged pull-down circuits, and a pull-down holding circuit; wherein the N-staged pull-up circuits and the pull-down holding circuit respectively connect to the Nth-staged gate signal point and the Nth-staged horizontal scanning line, and the N-staged pull-up control circuits and the N-staged pull-down circuits connected to the Nth-staged gate signal point wherein the (N+1)-staged pull-up circuits and the pull-down holding circuit respectively connect to the (N+1)th-staged gate signal point and the (N+1)th-staged horizontal scanning line, and the (N+1)-staged pull-up control circuits and the (N+1)-staged pull-down circuits connect to the (N+1)th-staged gate signal point; wherein the pull-down holding circuit holds the voltage level of the Nth-staged gate signal point and the Nth-staged horizontal scanning line to the low level after the Nth-staged horizontal scanning line is charged, and holds the voltage level of the (N+1)th-staged gate signal point and the (N+1)th-staged horizontal scanning line to the low level after the Nth-staged horizontal scanning line is charged.

In one embodiment, the pull-down holding circuit comprises: a first transistor having a gate and a drain connected to a first clock signal; a second transistor having a gate connected to the source of the first transistor, a drain connected to the first clock signal, and a source connected to a first common point; a third transistor having a gate connected to the second clock signal, a drain connected to the first clock signal, and a source connected to the first common point; a fourth transistor having a gate and drain connected to the first common point; a fifth transistor having a gate connected to the Nth-staged gate signal point, a drain connected to the source of the first transistor and the source of the fourth transistor, and a source connected to the first direct current low voltage; a sixth transistor having a gate connected to the (N+1)th-staged gate signal point, a drain connected to the source of the first transistor, and a source connected to the first direct current low voltage; a seventh transistor having a gate connected to the first common point, a drain connected to the (N+1)th-staged gate signal point, and a source connected to the first direct current low voltage; an eighth transistor having a gate connected to the first common point, a drain connected to the (N+1)th-staged horizontal scanning line and a source connected to the first direct current low voltage; a ninth transistor having a gate connected to a second common point, a drain connected to the (N+1)-staged gate signal point, and a source connected to the first direct current low voltage; a tenth transistor having a gate connected to the second common point, a drain connected to the (N+1)th-staged horizontal scanning line, and a source connected to the first direct current low voltage; an eleventh transistor having a gate and a drain connected to the second clock signal; a twelfth transistor having a gate connected to the source of the eleventh transistor, a drain connected to the second clock signal, and a source connected to the second common point; a thirteenth transistor having a gate connected to the first clock signal, a drain connected to the second clock signal, and a source connected to the second common point; a fourteenth transistor having a gate and a drain connected to the second common point; a fifteenth transistor having a gate connected to the Nth-staged gate signal point, a drain connected to the source of the eleventh transistor and the source of the fourteenth transistor, and a source connected to the first direct current low voltage; a sixteenth transistor having a gate connected to the (N+1)th-staged gate signal point, a drain connected to the source of the eleventh transistor, and a source connected to the first direct current low voltage; a seventh transistor having a gate connected to the second common point, a drain connected to the Nth-staged gate signal point, and a source connected to the first direct current low voltage; an eighteenth transistor having a gate connected to the second common point, a drain connected to the Nth-staged horizontal scanning line, and a source connected to the first direct current low voltage; a nineteenth transistor having a gate connected to the first common point, a drain connected to the Nth-staged gate signal point, and a source connected to the first direct current low voltage; and a twentieth transistor having a gate connected to the first common point, a drain connected to the Nth-staged horizontal scanning line, and a source connected to the first direct current low voltage.

In one embodiment, the pull-down holding circuit further comprises: a twenty-second transistor having a gate connected to the (N+1)th-staged gate signal point, and a drain and a source connected to the first common point and the second common point respectively.

In one embodiment, the GOA unit further comprises a Nth-staged transfer circuit and a (N+1)th-staged transfer circuit; the Nth-staged transfer circuit is connected to the Nth-staged gate signal point for providing N-staged transfer signals to the (N+1)th-staged transfer control circuit; the (N+1)th-staged transfer circuit is connected to the (N+1)th-staged gate signal point for providing (N+1)-staged transfer signals to the (N+2)th-staged transfer control circuit of the next-staged GOA unit.

In one embodiment, the pull-down holding circuit further comprises a twenty-third transistor having a gate connected to the (N+1)th-staged horizontal scanning line, a drain connected to the first common point, and a source connected to the first direct current low voltage; and a twenty-fourth transistor having a gate connected to the Nth horizontal scan line, a drain connected to the second common point, and a source connected to the first direct current low voltage.

In one embodiment, the gate of the twenty-third transistor is connected to the (N+1)-staged transfer signals; the gate of the twenty-fourth transistor is connected to the N-staged transfer signals.

In one embodiment, the source of the seventh transistor, the source of the ninth transistor, the source of the seventeenth transistor, and the source of the nineteenth transistor are connected to the second direct current low voltage.

In one embodiment, the pull-down holding circuit further comprises: a twenty-fifth transistor having a gate connected to the first common point, a drain connected to the (N+1)-staged transfer signals, and a source connected to the second direct current low voltage; a twenty-sixth transistor having a gate connected to the second common point, a drain connected to the (N+1)-staged transfer signals, and a source connected to the second direct current low voltage; a twenty-seventh transistor having a gate connected to the second common point, a drain connected to the N-staged transfer signals, and a source connected to the second direct current low voltage; and a twenty-eighth transistor having a gate connected to the first common point, a drain connected to the N-staged transfer signals, and a source connected to the second direct current low voltage.

In one embodiment, the GOA unit further comprises a reset circuit connected to the Nth-staged gate signal point, the (N+1)th-staged gate signal point and the first direct current low voltage, for pulling down the voltage level of the Nth-staged gate signal point and the (N+1)th-staged gate signal point to the low voltage level after a reset signal is received.

In order to solve the above technical problem, another technical solution adopted by the present disclosure is to provide a liquid crystal display comprising a GOA circuit, the GOA circuit comprising a plurality of GOA units, each of the GOA unit sequentially charging the Nth-staged horizontal scanning lines and the (N+1)th-staged horizontal scanning lines in the display region, the GOA unit comprising N-staged pull-up control circuits, (N+1)-staged pull-up control circuits, N-staged pull-up circuits, (N+1)-staged pull-up circuits, N-staged pull-down circuits, (N+1)-staged pull-down circuits, and a pull-down holding circuit; wherein the N-staged pull-up circuits and the pull-down holding circuit respectively connect to the Nth-staged gate signal point and the Nth-staged horizontal scanning line, and the N-staged pull-up control circuits and the N-staged pull-down circuits connected to the Nth-staged gate signal point; wherein the (N+1)-staged pull-up circuits and the pull-down holding circuit respectively connect to the (N+1)th-staged gate signal point and the (N+1)th-staged horizontal scanning line, and the (N+1)-staged pull-up control circuits and the (N+1)-staged pull-down circuits connect to the (N+1)th-staged gate signal point; wherein the pull-down holding circuit holds the voltage level of the Nth-staged gate signal point and the Nth-staged horizontal scanning line to the low level after the Nth-staged horizontal scanning line is charged, and holds the voltage level of the (N+1)th-staged gate signal point and the (N+1)th-staged horizontal scanning line to the low level after the Nth-staged horizontal scanning line is charged.

Distinguishing from the current technology, the beneficial effects of the present disclosure is that the two-stated GOA units share the same one pull-down holding circuit by coupling the two-stated adjacent GOA units. The pull-down holding circuit holds the first-staged GOA circuit to the low voltage level after the first-staged GOA circuit is charged, and holds the second-staged GOA circuit to the low voltage level after the second-staged GOA circuit is charged. Half of the power consumption of the pull-down holding circuit in the liquid crystal display may be reduced by way of such configuration to further reduce the energy consumption.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION

Figure 1:
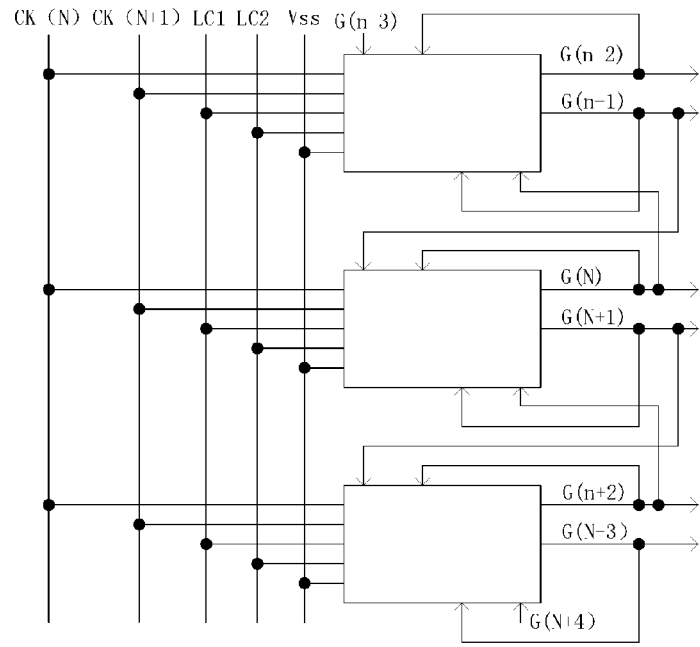
FIG. 1 is the schematic diagram illustrating the connection of each GOA unit in the first embodiment of the GOA circuit of the disclosure.

Refer to FIG. 1, which is the schematic diagram illustrating the connection of each GOA unit in the first embodiment of the GOA circuit of the disclosure. The GOA circuit comprises a plurality of GOA units. Each of the GOA unit sequentially charges the two-staged adjacent horizontal scanning lines in the display region.

Figure 2:
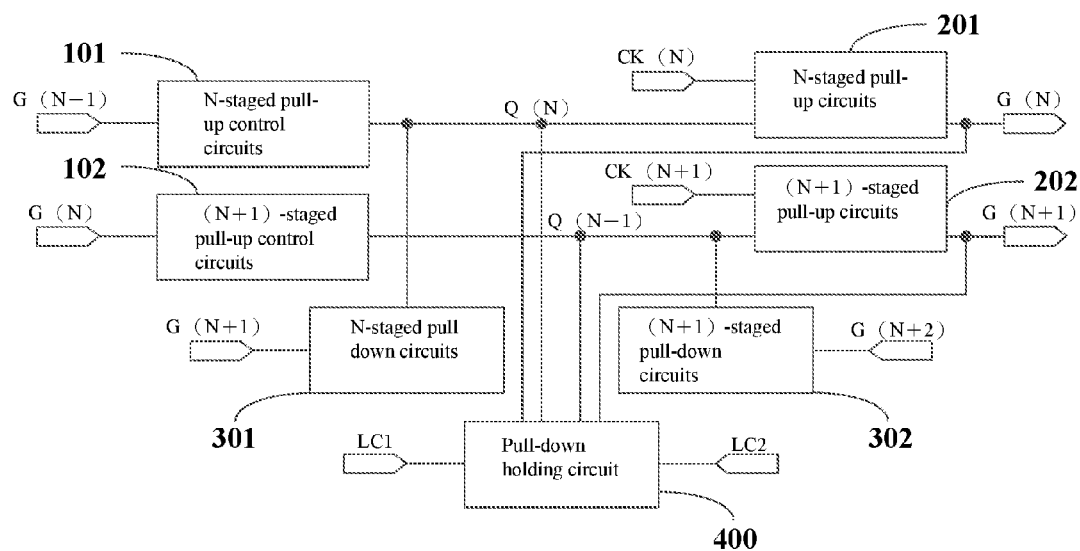
FIG. 2 is the schematic diagram illustrating the circuit connection of the GOA unit in the first embodiment of the GOA circuit of the disclosure.

The GOA unit charging the Nth-staged horizontal scanning line G(N) and the (N+1)th-staged horizontal scanning line G(N+1) is taken as an example in the following. Refer to FIG. 2, which is schematic diagram illustrating the circuit connection of the GOA unit in the first embodiment of the GOA circuit of the disclosure. The GOA unit comprises N-staged pull-up control circuits 101, (N+1)-staged pull-up control circuits 102, N-staged pull-up circuits 201, (N+1)-staged pull-up circuits 202, N-staged pull-down circuits 301, (N+1)-staged pull-down circuits 302, and a pull-down holding circuit 400.

The N-staged pull-up circuits 201 and the pull-down holding circuit 400 are connected to the Nth-staged gate signal point Q(N) and the Nth-staged horizontal scanning line G(N). The N-staged pull-up control circuits 101, and the N-staged pull-down circuits 301 are connected to the Nth-staged gate signal point Q(N).

The (N+1)-staged pull-up circuits 202 and the pull-down holding circuit 400 respectively connect to the (N+1)th-staged gate signal point Q(N+1) and the (N+1)th-staged horizontal scanning line G(N+1). The (N+1)-staged pull-up control circuits 102, and the (N+1)-staged pull-down circuits 302 connect to the (N+1)th-staged gate signal point Q(N+1).

The pull-down holding circuit 400 holds the voltage level of the Nth-staged gate signal point Q(N) and the Nth-staged horizontal scanning line G(N) to the low level after the Nth-staged horizontal scanning line G(N) is charged, and holds the voltage level of the (N+1)th-staged gate signal point Q(N+1) and the (N+1)th-staged horizontal scanning line G(N+1) to the low level after the (N+1)th-staged horizontal scanning line G(N+1) is charged.

Specifically, the N-staged pull-up control circuit 101 pulls up the voltage level of the Nth-staged gate signal point Q(N) to the high level and controls the N-staged pull-up circuits 201 to turn on after receiving the G(N−1) signal of the former-staged GOA unit. The N-staged pull-up control circuit 101 receives the N-staged clock signal CK(N) to charge the Nth-staged horizontal scanning line G(N). After the charge is completed, the N-staged pull-down circuit 301 pulls down the voltage level of the Nth-staged gate signal point Q(N) to the low level and turns off the N-staged pull-up circuits 201. The pull-down holding circuit 400 pulls down the voltage level of the Nth-staged gate signal point Q(N) and the Nth-staged horizontal scanning line G(N) to the low level and holds the low level.

The scanning signal G(N) outputted from the Nth-staged horizontal scanning line G(N) is used as the input signal for the (N+1)-staged pull-up control circuit in the (N+1)-staged circuit. The operation principle of the (N+1)-staged circuit and the N-staged circuit is the same. The difference merely lies in the control signal for the pull-up control circuit and the pull-down circuit. During the operation of the two-staged circuit, the pull-down holding circuit 400 pulls down the voltage level of the two-stated circuits to the low level at the same time under the control of the first clock signal LC1 and the second clock signal LC2 and holds the low level.

Distinguishing from the current technology, the two-stated GOA units share the same one pull-down holding circuit by coupling the two-stated adjacent GOA units. The pull-down holding circuit holds the first-staged GOA circuit to the low voltage level after the first-staged GOA circuit is charged, and holds the second-staged GOA circuit to the low voltage level after the second-staged GOA circuit is charged. Half of the power consumption of the pull-down holding circuit in the liquid crystal display may be reduced by way of such configuration to further reduce the energy consumption.

Figure 3:
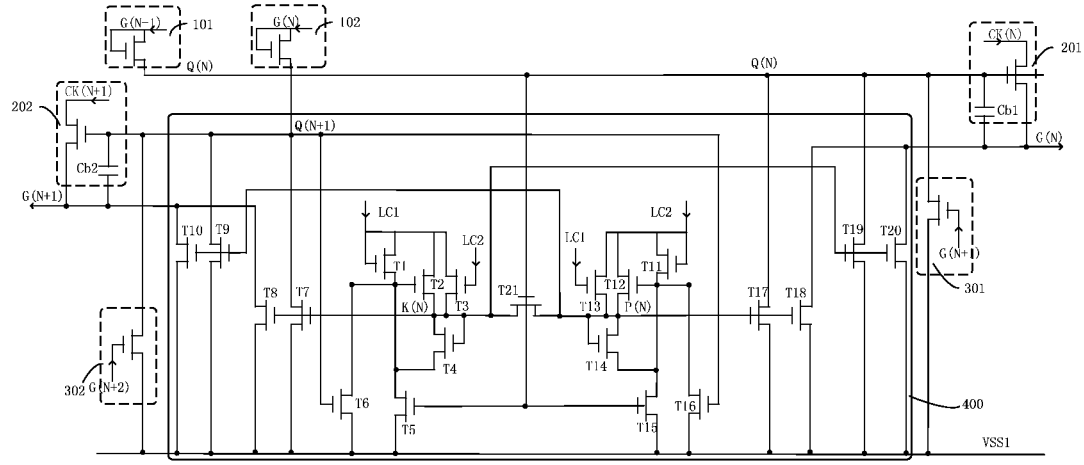
FIG. 3 is the schematic diagram illustrating the specific circuit connection of the GOA unit in the second embodiment of the circuit of the disclosure.

Refer to FIG. 3 for the schematic diagram illustrating the specific circuit connection of the GOA unit in the second embodiment of the circuit of the disclosure. The GOA unit comprises N-staged pull-up control circuits 101, (N+1)-staged pull-up control circuits 102, N-staged pull-up circuits 201, (N+1)-staged pull-up circuits 202, N-staged pull-down circuits 301, (N+1)-staged pull-down circuits 302, and a pull-down holding circuit 400. The pull-down holding circuit comprises 400 comprises a first transistor T1 having a gate and a drain connected to a first clock signal LC1; a second transistor T2 having a gate connected to the source of the first transistor T1, a drain connected to the first clock signal LC1, and a source connected to a first common point K(N); a third transistor T3 having a gate connected to the second clock signal LC2, a drain connected to the first clock signal LC1, and a source connected to the first common point K(N); a fourth transistor having a gate and a drain connected to the first common point K(N); a fifth transistor T5 having a gate connected to the Nth-staged gate signal point Q(N), a drain connected to the source of the first transistor T1 and the source of the fourth transistor T4, and a souse connected to the first direct current low voltage VSS1; a sixth transistor T6 having a gate connected to the (N+1)th-staged gate signal point Q(N+1), a drain connected to the source of the first transistor T1, and a sauce connected to the first direct current low voltage VSS1; a seventh transistor T7 having a gate connected to the first common point K(N), a drain connected to the (N+1)th-staged gate signal point Q(N+1), and a source connected to the first direct current low voltage VSS1; an eighth transistor T8 having a gate connected to the first common point K(N), a drain connected to the (N+1)th-staged horizontal scanning line G(N+1) and a source connected to the first direct current low voltage VSS1; a ninth transistor T9 having a gate connected to a second common point P(N), a drain connected to the (N+1)th-staged gate signal point Q(N+1), and a source connected to the first direct current low voltage VSS1; an eleventh transistor T11 having a gate and a drain connected to the second clock signal LC2; a twelfth transistor T12 having a gate connected to the source of the eleventh transistor T11, a drain connected to the second clock signal LC2, and a source connected to the second common point P(N); a thirteenth transistor T13 having a gate connected to the first clock signal LC1, a drain connected to the second clock signal LC2, and a source connected to the second common point P(N); a fourteenth transistor T14 having a gate and a drain connected to the second common point P(N); a fifteenth transistor T15 having a gate connected to the Nth-staged gate signal point Q(N), a drain connected to the source of the eleventh transistor T11 and the source of the fourteenth transistor T14, and a source connected to the first direct current low voltage VSS1; a seventh transistor T17 having a gate connected to the second common point P(N), a drain connected to the Nth-staged gate signal point Q(N), and a source connected to the first direct current low voltage VSS1; an eighteenth transistor T18 having a gate connected to the second common point P(N), a drain connected to the Nth-staged horizontal scanning line G(N), and a source connected to the first direct current low voltage VSS1; a nineteenth transistor T19 having a gate connected to the first common point K(N), a drain connected to the Nth-staged gate signal point Q(N), and a source connected to the first direct current low voltage VSS1; and a twentieth transistor T20 having a gate connected to the first common point, a drain connected to the Nth-staged horizontal scanning line G(N), and a source connected to the first direct current low voltage VSS1.

Figure 4:
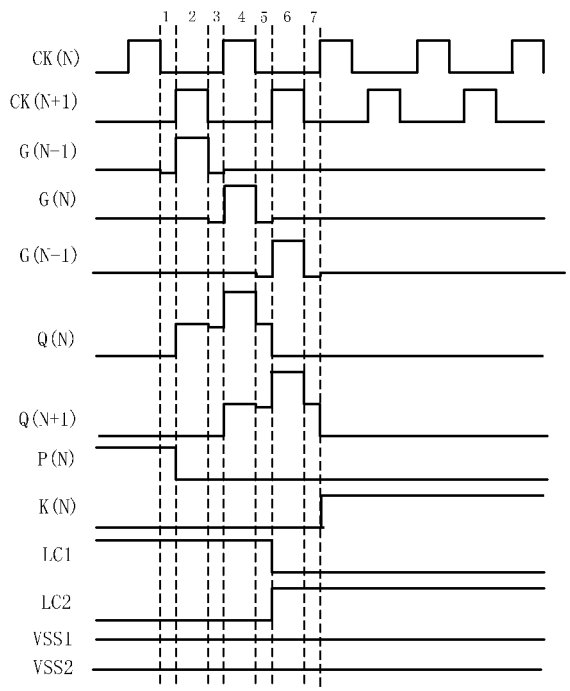
FIG. 4 is the schematic waveform diagram for each signal in the specific circuit of the GOA unit in the second embodiment of the circuit of the disclosure.

Refer to FIG. 4 for the schematic waveform diagram for each signal in the specific circuit of the GOA unit in the second embodiment of the circuit of the disclosure. The waveform diagram is divided into seven operation sections by the dotted lines in FIG. 4.

In the operation section I, G(N−1) is at low voltage level, the N-staged pull-up control circuit 101 turns off, Q(N) point is at low voltage level, and N-staged pull-up circuit 201 turns off. Due to the functioning of LC1 and LC2, P(N) point is at high voltage level, T12 is conductive, and the G(N) is at the low voltage level. The (N+1)-staged pull-up control circuit 102 turns off. Q(N+1) point is at the low voltage level. The (N+1)-staged pull-up circuit 202 turns off. Due to the functioning of LC1 and LC2, P(N) point is at high voltage level, T10 is conductive, and the output of G(N+1) is at the low voltage level.

In the operation section II, G(N−1) is at high voltage level, and the N-staged pull-up control circuit 101 turns on. Q(N) point is at high voltage level, and N-staged pull-up circuit 201 turns on. Because CK(N) is still at low voltage level, the output of G(N) is still at low voltage level. Further, because Q(N) is at the high voltage level such that T21, T5 and T15 turn on, that is P(N) and K(N) is at the low voltage level at the same time, G(N+1) continues to be at the low voltage level.

In the operation section III, G(N−1) is low voltage level, and the N-staged pull-up control circuit 101 turns off. The voltage level of Q(N) point slightly lowers. The other key points substantially remain the same.

In the operation section IV, the functioning of the first capacitor Cb1 in the N-staged pull-up circuit 201 raises the voltage of the Q(N) point to a higher level. The N-staged pull-up circuit 201 still turns on. At this time, the N-staged clock signal CK(N) becomes high voltage level, and G(N) is charged.

Because the level of G(N) becomes high, the (N+1)-staged pull-up control circuit 102 turns on, and Q(N+1) becomes high voltage level. The (N+1)-staged pull-up circuit 202 turns on. But, at this time, the (N+1)-staged clock signal becomes low, and G(N+1) is still at low level.

In the operation section V, the N-staged clock signal CK(N) becomes low voltage level, and charging of G(N) is completed such that the (N+1)-staged pull-up control circuit 102 turns off. The other key points substantially remain the same.

In the operation section VI, the functioning of the second capacitor Cb2 in the (N+1)-staged pull-up circuit 202 raises the voltage of the Q(N+1) point to a higher level. The (N+1)-staged pull-up circuit 202 still turns on. At this time, the (N+1)-staged clock signal CK(N+1) becomes high voltage level, and G(N+1) is charged.

Because the level of G(N+1) high, the first pull-down circuit 301 turns on and pulls down the voltage of Q(N). T21, T5 and T15 turn off. Because the functioning of Q(N+1), and the variation of Lc1 and LC2, P(N) and K(N) are still low.

In the operation section VII, the (N+1)-staged clock signal CK(N+1) becomes low voltage level, and the charging of G(N+1) is completed. The other key points substantially remain the same.

Figure 5:
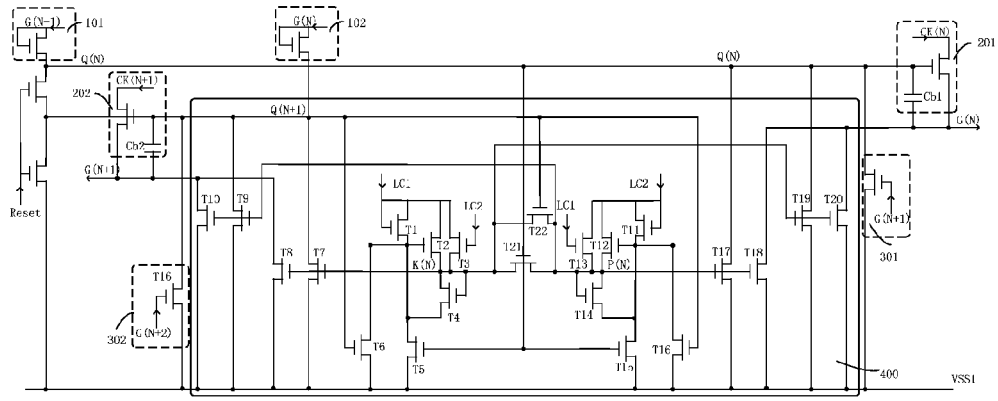
FIG. 5 is the schematic diagram illustrating the specific circuit connection of the GOA unit in the third embodiment of the circuit of the disclosure.

Refer to FIG. 5 for the schematic diagram illustrating the specific circuit connection of the GOA unit in the third embodiment of the circuit of the disclosure. The difference between the GOA unit and the second embodiment as mentioned above is described as below.

The pull-down holding circuit 400 further comprises: a twenty-second transistor T22 having a gate connected to the (N+1)th-staged gate signal point Q(N+1), and a drain and a source connected to the first common point K(N) and the second common point P(N) respectively.

Because the pull-down holding circuit 400 needs to pull down and hold the two-staged circuits at the same time, T22 and T21 are adopted to function commonly to ensure the normal output of the two-staged circuits. The circuit is more safety, and more stable.

Figure 6:
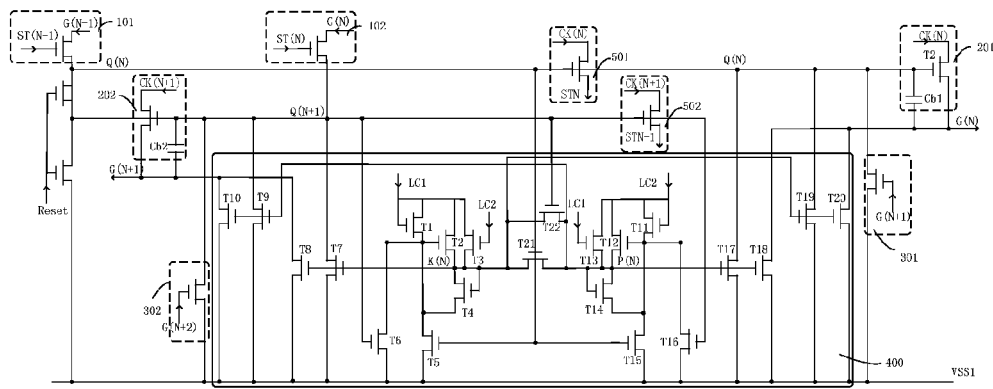
FIG. 6 is the schematic diagram illustrating the specific circuit connection of the GOA unit in the fourth embodiment of the circuit of the disclosure.

Refer to FIG. 6 for the schematic diagram illustrating the specific circuit connection of the GOA unit in the fourth embodiment of the circuit of the disclosure. The difference between the GOA unit and the third embodiment as mentioned above is described as below.

The GOA unit further comprises a Nth-staged transfer circuit 501 and a (N+1)th-staged transfer circuit 502. The Nth-staged transfer circuit 501 is connected to the Nth-staged gate signal point Q(N) for providing N-staged transfer signals ST(N) to the (N+1)th-staged transfer control circuit. The (N+1)th-staged transfer circuit 502 is connected to the (N+1)th-staged gate signal point Q(N+1) for providing (N+1)-staged transfer signals ST(N+1) to the (N+2)th-staged transfer control circuit of the next-staged GOA unit.

In the embodiment, the control signals for the N-staged pull-up control circuits 101 and the (N+1)-staged pull-up control circuits 102 are substituted as ST(N−1) and ST(N) respectively, that is the gates of the TFT transistors in the N-staged pull-up control circuits 101 and the (N+1)-staged pull-up control circuits 102 are connected to the ST(N−1) and ST(N) respectively.

Figure 7:
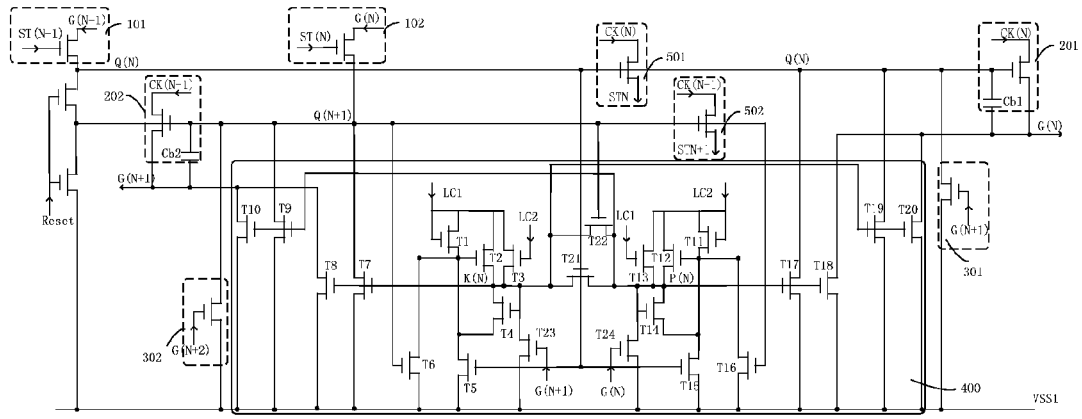
FIG. 7 is the schematic diagram illustrating the specific circuit connection of the GOA unit in the fifth embodiment of the circuit of the disclosure.

Refer to FIG. 7 for the schematic diagram illustrating the specific circuit connection of the GOA unit in the fifth embodiment of the circuit of the disclosure. The difference between the GOA unit and the fourth embodiment as mentioned above is described as below.

The pull-down holding circuit further comprises: a twenty-third transistor T23 having a gate connected to the (N+1)th-staged horizontal scanning line G(N+1), a drain connected to the first common point K(N), and a source connected to the first direct current low voltage VSS1; and a twenty-fourth transistor T24 having a gate connected to the Nth horizontal scan line G(N), a drain P(N) connected to the second common point, and a source connected to the first direct current low voltage VSS1.

Because the pull-down during the output period, this embodiment adopts two additional TFT transistors for enhancing the pull-down for P(N) and K(N) during the operation period. If the effect of the pulling down is not good, the display will be abnormal.

Furthermore, the gate signal of the N-staged pull-down circuits may be changed as ST(N+1), and gate signal of the (N+1)-staged pull-down circuits may be changed as ST(N+2), the gate signal of T23 mat be changed as ST(N+1), and the gate signal of T24 may be changed as ST(N) for preventing the transistors from electricity leakage.

Figure 8:
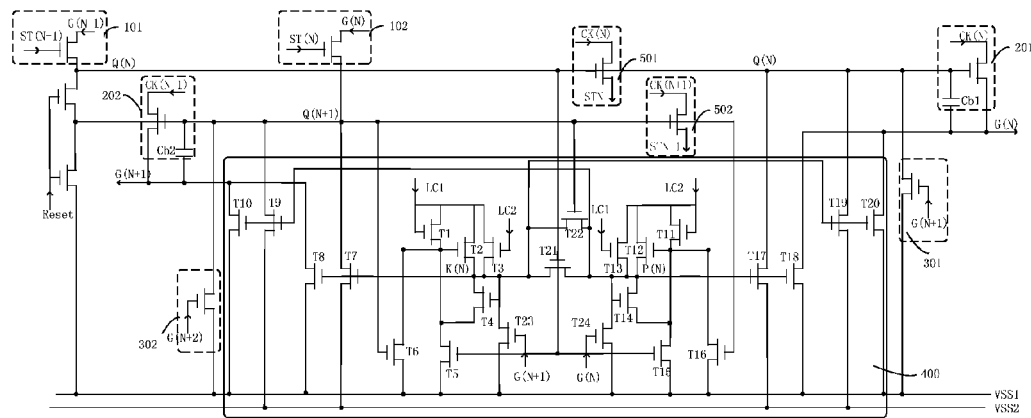
FIG. 8 is the schematic diagram illustrating the specific circuit connection of the GOA unit in the sixth embodiment of the circuit of the disclosure.

Refer FIG. 8 for the schematic diagram illustrating the specific circuit connection of the GOA unit in the sixth embodiment of the circuit of the disclosure. The difference between the GOA unit and the fifth embodiment as mentioned above is described as below.

The source of the seventh transistor T7, the source of the ninth transistor T9, the source of the seventeenth transistor T17, and the source of the nineteenth transistor T19 are connected to the second direct current low voltage VSS2.

Figure 9:
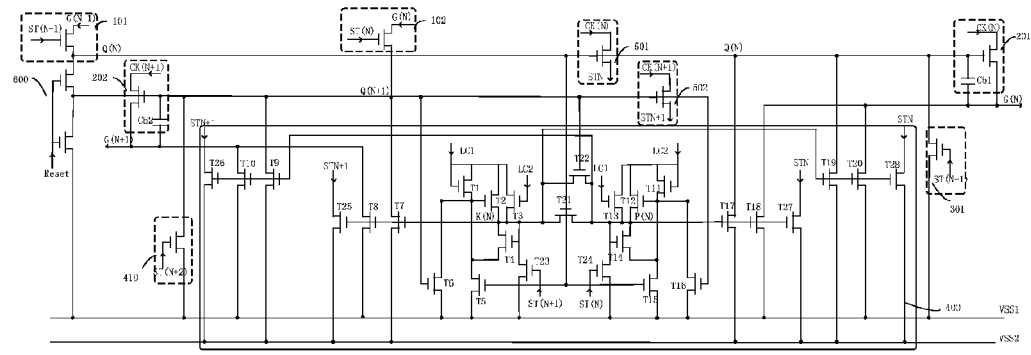
FIG. 9 is the schematic diagram illustrating the specific circuit connection of the GOA unit in the seventh embodiment of the circuit of the disclosure.

Refer to FIG. 9 for the schematic diagram illustrating the specific circuit connection of the GOA unit in the seventh embodiment of the circuit of the disclosure. The difference between the GOA unit and the fifth embodiment as mentioned above lies in the pull-down holding circuit further comprises:

a twenty-fifth transistor T25 having a gate connected to the first common point K(N), a drain connected to the (N+1)-staged transfer signals ST(N+1), and a source connected to the second direct current low voltage VSS2;

a twenty-sixth transistor T26 having a gate connected to the second common point P(N), a drain connected to the (N+1)-staged transfer signals ST(N+1), and a source connected to the second direct current low voltage VSS2;

a twenty-seventh transistor T27 having a gate connected to the second common point P(N), a drain connected to the N-staged transfer signals ST(N), and a source connected to the second direct current low voltage VSS2; and a twenty-eighth transistor T28 having a gate connected to the first common point K(N), a drain connected to the N-staged transfer signals ST(N), and a source connected to the second direct current low voltage VSS2.

Further, the gate signal of the N-staged signal may be changed as ST(N+2), and the gate signal of the (N+1)-staged pull-down circuit may be changed as ST(N+3) for facilitating Q(N) point to form better "⊓"-shaped waveform.

Figure 10:
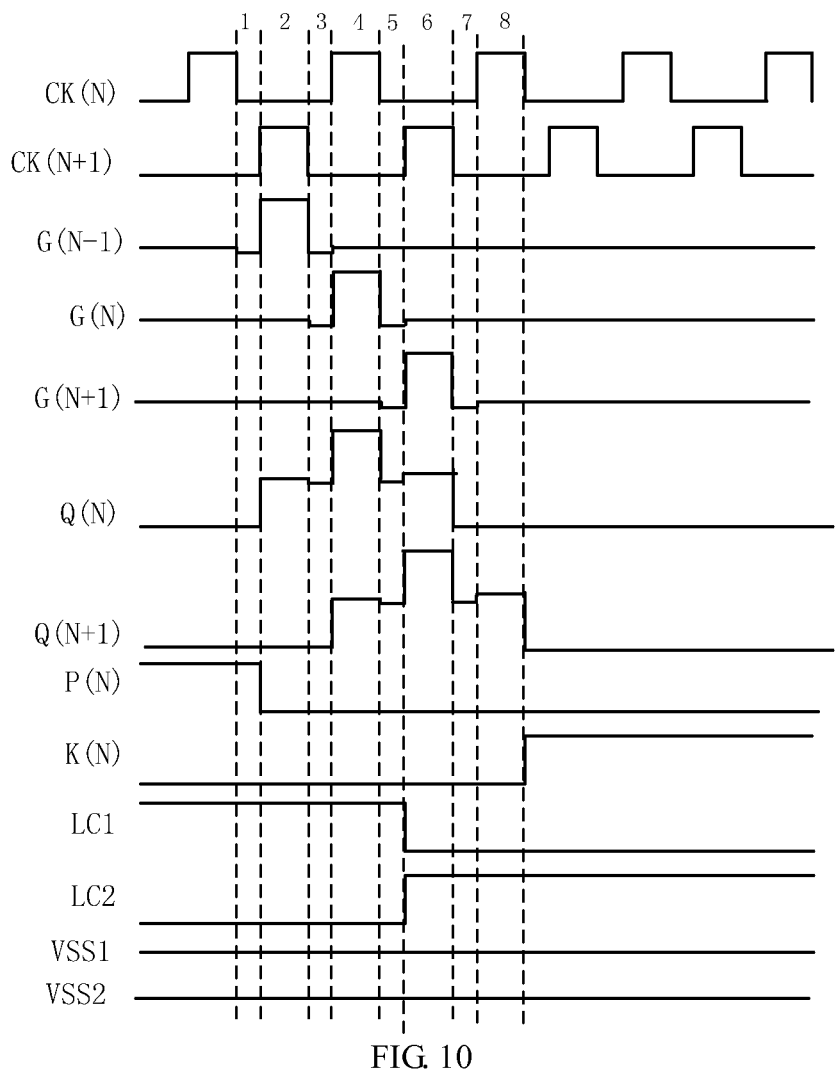
FIG. 10 is the schematic waveform diagram for each signal in the specific circuit of the GOA unit in the seventh embodiment of the circuit of the disclosure.

Refer to FIG. 10 for the schematic waveform diagram for each signal in the specific circuit of the GOA unit in the seventh embodiment of the circuit of the disclosure. The waveform diagram is similar to FIG. 4. The difference lies in that the "⊓"-shaped waveforms of Q(N) and Q(N+1) are more complete.

The above embodiments adopt NTFT as examples. They may be substituted as PTFT during practical implementation. The high and low voltage level for controlling the gate is switched. The timing of the voltage level does not change.

Although the present disclosure is illustrated and described with reference to specific embodiments, those skilled in the art will understand that many variations and modifications are readily attainable without departing from the spirit and scope thereof as defined by the appended claims and their legal equivalents.

What is claimed is:

1. A gate driver on array (GOA) circuit for a liquid crystal display, the GOA circuit comprising a plurality of GOA units, each of the GOA unit sequentially charging Nth-staged horizontal scanning lines and (N+1)th-staged horizontal scanning lines in the display region, the GOA unit comprising N-staged pull-up control circuits, (N+1)-staged pull-up control circuits, N-staged pull-up circuits, (N+1)-staged pull-up circuits, N-staged pull-down circuits, (N+1)-staged pull-down circuits, and a pull-down holding circuit;

wherein the N-staged pull-up circuits and the pull-down holding circuit respectively connect to a Nth-staged gate signal point and the Nth-staged horizontal scanning line, and the N-staged pull-up control circuits and the N-staged pull-down circuits connected to the Nth-staged gate signal point;

wherein the (N+1)-staged pull-up circuits and the pull-down holding circuit respectively connect to a (N+1)th-staged gate signal point and the (N+1)th-staged horizontal scanning line, and the (N+1)-staged pull-up control circuits and the (N+1)-staged pull-down circuits connect to the (N+1)th-staged gate signal point;

wherein the pull-down holding circuit holds the voltage level of the Nth-staged gate signal point and the Nth-staged horizontal scanning line to the low level after the Nth-staged horizontal scanning line is charged, and holds the voltage level of the (N+1)th-staged gate signal point and the (N+1)th-staged horizontal scanning line to the low level after the Nth-staged horizontal scanning line is charged;

wherein the pull-down holding circuit comprises:

a first transistor having a gate and a drain connected to a first clock signal;

a second transistor having a gate connected to the source of the first transistor, a drain connected to the first clock signal, and a source connected to a first common point;

a third transistor having a gate connected to a second clock signal, a drain connected to the first clock signal, and a source connected to the first common point;

a fourth transistor having a gate and drain connected to the first common point;

a fifth transistor having a gate connected to the Nth-staged gate signal point, a drain connected to the source of the first transistor and the source of the fourth transistor, and a source connected to a first direct current low voltage;

a sixth transistor having a gate connected to the (N+1)th-staged gate signal point, a drain connected to the source of the first transistor, and a source connected to the first direct current low voltage;

a seventh transistor having a gate connected to the first common point, a drain connected to the (N+1)th-staged gate signal point, and a source connected to the first direct current low voltage;

an eighth transistor having a gate connected to the first common point, a drain connected to the (N+1)th-staged horizontal scanning line and a source connected to the first direct current low voltage;

a ninth transistor having a gate connected to a second common point, a drain connected to the (N+1)-staged gate signal point, and a source connected to the first direct current low voltage;

a tenth transistor having a gate connected to the second common point, a drain connected to the (N+1)th-staged horizontal scanning line, and a source connected to the first direct current low voltage;

an eleventh transistor having a gate and a drain connected to the second clock signal;

a twelfth transistor having a gate connected to the source of the eleventh transistor, a drain connected to the second clock signal, and a source connected to the second common point;

a thirteenth transistor having a gate connected to the first clock signal, a drain connected to the second clock signal, and a source connected to the second common point;

a fourteenth transistor having a gate and a drain connected to the second common point;

a fifteenth transistor having a gate connected to the Nth-staged gate signal point, a drain connected to the source of the eleventh transistor and the source of the fourteenth transistor, and a source connected to the first direct current low voltage;

a sixteenth transistor having a gate connected to the (N+1)th-staged gate signal point, a drain connected to the source of the eleventh transistor, and a source connected to the first direct current low voltage;

a seventh transistor having a gate connected to the second common point, a drain connected to the Nth-staged gate signal point, and a source connected to the first direct current low voltage;

an eighteenth transistor having a gate connected to the second common point, a drain connected to the Nth-staged horizontal scanning line, and a source connected to the first direct current low voltage;

a nineteenth transistor having a gate connected to the first common point, a drain connected to the Nth-staged gate signal point, and a source connected to the first direct current low voltage; and a twentieth transistor having a gate connected to the first common point, a drain connected to the Nth-staged horizontal scanning line, and a source connected to the first direct current low voltage;

wherein the GOA unit further comprises a reset circuit connected to the Nth-staged gate signal point, the (N+1)th-staged gate signal point and the first direct current low voltage, for pulling down the voltage level of the Nth-staged gate signal point and the (N+1)th-staged gate signal point to the low voltage level after a reset signal is received.

2. The GOA circuit according to claim 1, wherein the pull-down holding circuit further comprises:

a twenty-second transistor having a gate connected to the (N+1)th-staged gate signal point, and a drain and a source connected to the first common point and the second common point respectively.

3. The GOA circuit according to claim 1, wherein the GOA unit further comprises a Nth-staged transfer circuit and a (N+1)th-staged transfer circuit;

the Nth-staged transfer circuit is connected to the Nth-staged gate signal point for providing N-staged transfer signals to the (N+1)th-staged transfer control circuit;

the (N+1)th-staged transfer circuit is connected to the (N+1)th-staged gate signal point for providing (N+1)-staged transfer signals to the (N+2)th-staged 10 transfer control circuit of the next-staged GOA unit.

4. The GOA circuit according to claim 1, wherein the pull-down holding circuit further comprises:

a twenty-third transistor having a gate connected to the (N+1)th-staged horizontal scanning line, a drain connected to the first common point, and a source connected to the first direct current low voltage; and a twenty-fourth transistor having a gate connected to the Nth horizontal scan line, a drain connected to the second common point, and a source connected to the first direct current low voltage.

5. The GOA circuit according to claim 4, wherein the gate of the twenty-third transistor is connected to the (N+1)-staged transfer signals; the gate of the twenty-fourth transistor is connected to the N-staged transfer signals.

6. The GOA circuit according to claim 5, wherein the source of the seventh transistor, the source of the ninth transistor, the source of the seventeenth transistor, and the source of the nineteenth transistor are connected to the second direct current low voltage.

7. The GOA circuit according to claim 5, wherein the pull-down holding circuit further comprises:
    a twenty-fifth transistor having a gate connected to the first common point, a drain connected to the (N+1)-staged transfer signals, and a source connected to the second direct current low voltage;
    a twenty-sixth transistor having a gate connected to the second common point, a drain connected to the (N+1)-staged transfer signals, and a source connected to the second direct current low voltage;
    a twenty-seventh transistor having a gate connected to the second common point, a drain connected to the N-staged transfer signals, and a source connected to the second direct current low voltage; and
    a twenty-eighth transistor having a gate connected to the first common point, a drain connected to the N-staged transfer signals, and a source connected to the second direct current low voltage.

8. A gate driver on array (GOA) circuit for a liquid crystal display, the GOA circuit comprising a plurality of GOA units, each of the GOA unit sequentially charging Nth-staged horizontal scanning lines and (N+1)th-staged horizontal scanning lines in the display region, the GOA unit comprising N-staged pull-up control circuits, (N+1)-staged pull-up control circuits, N-staged pull-up circuits, (N+1)-staged pull-up circuits, N-staged pull-down circuits, (N+1)-staged pull-down circuits, and a pull-down holding circuit;
    wherein the N-staged pull-up circuits and the pull-down holding circuit respectively connect to a Nth-staged gate signal point and the Nth-staged horizontal scanning line, and the N-staged pull-up control circuits and the N-staged pull-down circuits connected to the Nth-staged gate signal point;
    wherein the (N+1)-staged pull-up circuits and the pull-down holding circuit respectively connect to a (N+1)th-staged gate signal point and the (N+1)th-staged horizontal scanning line, and the (N+1)-staged pull-up control circuits and the (N+1)-staged pull-down circuits connect to the (N+1)th-staged gate signal point;
    wherein the pull-down holding circuit holds the voltage level of the Nth-staged gate signal point and the Nth-staged horizontal scanning line to the low level after the Nth-staged horizontal scanning line is charged, and holds the voltage level of the (N+1)th-staged gate signal point and the (N+1)th-staged horizontal scanning line to the low level after the Nth-staged horizontal scanning line is charged.

9. The GOA circuit according to claim 8, wherein the pull-down holding circuit comprises:
    a first transistor having a gate and a drain connected to a first clock signal;
    a second transistor having a gate connected to the source of the first transistor, a drain connected to the first clock signal, and a source connected to a first common point;
    a third transistor having a gate connected to a second clock signal, a drain connected to the first clock signal, and a source connected to the first common point;
    a fourth transistor having a gate and drain connected to the first common point;
    a fifth transistor having a gate connected to the Nth-staged gate signal point, a drain connected to the source of the first transistor and the source of the fourth transistor, and a source connected to a first direct current low voltage;
    a sixth transistor having a gate connected to the (N+1)th-staged gate signal point, a drain connected to the source of the first transistor, and a source connected to the first direct current low voltage;
    a seventh transistor having a gate connected to the first common point, a drain connected to the (N+1)th-staged gate signal point, and a source connected to the first direct current low voltage;
    an eighth transistor having a gate connected to the first common point, a drain connected to the (N+1)th-staged horizontal scanning line and a source connected to the first direct current low voltage;
    a ninth transistor having a gate connected to a second common point, a drain connected to the (N+1)-staged gate signal point, and a source connected to the first direct current low voltage;
    a tenth transistor having a gate connected to the second common point, a drain connected to the (N+1)th-staged horizontal scanning line, and a source connected to the first direct current low voltage;
    an eleventh transistor having a gate and a drain connected to the second clock signal;
    a twelfth transistor having a gate connected to the source of the eleventh transistor, a drain connected to the second clock signal, and a source connected to the second common point;
    a thirteenth transistor having a gate connected to the first clock signal, a drain connected to the second clock signal, and a source connected to the second common point;
    a fourteenth transistor having a gate and a drain connected to the second common point;
    a fifteenth transistor having a gate connected to the Nth-staged gate signal point, a drain connected to the source of the eleventh transistor and the source of the fourteenth transistor, and a source connected to the first direct current low voltage;
    a sixteenth transistor having a gate connected to the (N+1)th-staged gate signal point, a drain connected to the source of the eleventh transistor, and a source connected to the first direct current low voltage;
    a seventh transistor having a gate connected to the second common point, a drain connected to the Nth-staged gate signal point, and a source connected to the first direct current low voltage;
    an eighteenth transistor having a gate connected to the second common point, a drain connected to the Nth-staged horizontal scanning line, and a source connected to the first direct current low voltage;
    a nineteenth transistor having a gate connected to the first common point, a drain connected to the Nth-staged gate signal point, and a source connected to the first direct current low voltage; and a twentieth transistor having a gate connected to the first common point, a drain connected to the Nth-staged horizontal scanning line, and a source connected to the first direct current low voltage.

10. The GOA circuit according to claim 9, wherein the pull-down holding circuit further comprises:

a twenty-second transistor having a gate connected to the (N+1)th-staged gate signal point, and a drain and a source connected to the first common point and the second common point respectively.

11. The GOA circuit according to claim 10, wherein the GOA unit further comprises a Nth-staged transfer circuit and a (N+1)th-staged transfer circuit;

the Nth-staged transfer circuit is connected to the Nth-staged gate signal point for providing N-staged transfer signals to the (N+1)th-staged transfer control circuit;

the (N+1)th-staged transfer circuit is connected to the (N+1)th-staged gate signal point for providing (N+1)-staged transfer signals to the (N+2)th-staged transfer control circuit of the next-staged GOA unit.

12. The GOA circuit according to claim 11, wherein the pull-down holding circuit further comprises:

a twenty-third transistor having a gate connected to the (N+1)th-staged horizontal scanning line, a drain connected to the first common point, and a source connected to the first direct current low voltage; and a twenty-fourth transistor having a gate connected to the Nth horizontal scan line, a drain connected to the second common point, and a source connected to the first direct current low voltage.

13. The GOA circuit according to claim 12, wherein the gate of the twenty-third transistor is connected to the (N+1)-staged transfer signals; the gate of the twenty-fourth transistor is connected to the N-staged transfer signals.

14. The GOA circuit according to claim 13, wherein the source of the seventh transistor, the source of the ninth transistor, the source of the seventeenth transistor, and the source of the nineteenth transistor are connected to the second direct current low voltage.

15. The GOA circuit according to claim 14, wherein the pull-down holding circuit further comprises:

a twenty-fifth transistor having a gate connected to the first common point, a drain connected to the (N+1)-staged transfer signals, and a source connected to the second direct current low voltage;

a twenty-sixth transistor having a gate connected to the second common point, a drain connected to the (N+1)-staged transfer signals, and a source connected to the second direct current low voltage;

a twenty-seventh transistor having a gate connected to the second common point, a drain connected to the N-staged transfer signals, and a source connected to the second direct current low voltage; and a twenty-eighth transistor having a gate connected to the first common point, a drain connected to the N-staged transfer signals, and a source connected to the second direct current low voltage.

16. The GOA circuit according to claim 8, wherein the GOA unit further comprises a reset circuit connected to the Nth-staged gate signal point, the (N+1)th-staged gate signal point and the first direct current low voltage, for pulling down the voltage level of the Nth-staged gate signal point and the (N+1)th-staged gate signal point to the low voltage level after a reset signal is received.

17. A liquid crystal display comprising a gate driver on array (GOA) circuit, the GOA circuit comprising a plurality of GOA units, each of the GOA unit sequentially charging Nth-staged horizontal scanning lines and (N+1)th-staged horizontal scanning lines in the display region, the GOA unit comprising N-staged pull-up control circuits, (N+1)-staged pull-up control circuits, N-staged pull-up circuits, (N+1)-staged pull-up circuits, N-staged pull-down circuits, (N+1)-staged pull-down circuits, and a pull-down holding circuit;

wherein the N-staged pull-up circuits and the pull-down holding circuit respectively connect to a Nth-staged gate signal point and the Nth-staged horizontal scanning line, and the N-staged pull-up control circuits and the N-staged pull-down circuits connected to the Nth-staged gate signal point;

wherein the (N+1)-staged pull-up circuits and the pull-down holding circuit respectively connect to a (N+1)th-staged gate signal point and the (N+1)th-staged horizontal scanning line, and the (N+1)-staged pull-up control circuits and the (N+1)-staged pull-down circuits connect to the (N+1)th-staged gate signal point;

wherein the pull-down holding circuit holds the voltage level of the Nth-staged gate signal point and the Nth-staged horizontal scanning line to the low level after the Nth-staged horizontal scanning line is charged, and holds the voltage level of the (N+1)th-staged gate signal point and the (N+1)th-staged horizontal scanning line to the low level after the Nth-staged horizontal scanning line is charged.

18. The liquid crystal display according to claim 17, wherein the pull-down holding circuit comprises:

a first transistor having a gate and a drain connected to a first clock signal;

a second transistor having a gate connected to the source of the first transistor, a drain connected to the first clock signal, and a source connected to a first common point;

a third transistor having a gate connected to a second clock signal, a drain connected to the first clock signal, and a source connected to the first common point;

a fourth transistor having a gate and drain connected to the first common point;

a fifth transistor having a gate connected to the Nth-staged gate signal point, a drain connected to the source of the first transistor and the source of the fourth transistor, and a source connected to a first direct current low voltage;

a sixth transistor having a gate connected to the (N+1)th-staged gate signal point, a drain connected to the source of the first transistor, and a source connected to the first direct current low voltage;

a seventh transistor having a gate connected to the first common point, a drain connected to the (N+1)th-staged gate signal point, and a source connected to the first direct current low voltage;

an eighth transistor having a gate connected to the first common point, a drain connected to the (N+1)th-staged horizontal scanning line and a source connected to the first direct current low voltage;

a ninth transistor having a gate connected to a second common point, a drain connected to the (N+1)-staged gate signal point, and a source connected to the first direct current low voltage;

a tenth transistor having a gate connected to the second common point, a drain connected to the (N+1)th-staged horizontal scanning line, and a source connected to the first direct current low voltage;

an eleventh transistor having a gate and a drain connected to the second clock signal;
a twelfth transistor having a gate connected to the source of the eleventh transistor, a drain connected to the second clock signal, and a source connected to the second common point;
a thirteenth transistor having a gate connected to the first clock signal, a drain connected to the second clock signal, and a source connected to the second common point;
a fourteenth transistor having a gate and a drain connected to the second common point;
a fifteenth transistor having a gate connected to the Nth-staged gate signal point, a drain connected to the source of the eleventh transistor and the source of the fourteenth transistor, and a source connected to the first direct current low voltage;
a sixteenth transistor having a gate connected to the (N+1)th-staged gate signal point, a drain connected to the source of the eleventh transistor, and a source connected to the first direct current low voltage;
a seventh transistor having a gate connected to the second common point, a drain connected to the Nth-staged gate signal point, and a source connected to the first direct current low voltage;
an eighteenth transistor having a gate connected to the second common point, a drain connected to the Nth-staged horizontal scanning line, and a source connected to the first direct current low voltage;
a nineteenth transistor having a gate connected to the first common point, a drain connected to the Nth-staged gate signal point, and a source connected to the first direct current low voltage; and
a twentieth transistor having a gate connected to the first common point, a drain connected to the Nth-staged horizontal scanning line, and a source connected to the first direct current low voltage.

\* \* \* \* \*